United States Patent
Boettiger et al.

(10) Patent No.: US 9,497,366 B1
(45) Date of Patent: Nov. 15, 2016

(54) IMAGING SYSTEMS WITH INTEGRATED LIGHT SHIELD STRUCTURES

(71) Applicant: SEMICONDUCTOR COMPONENTS INDUSTRIES, LLC, Phoenix, AZ (US)

(72) Inventors: Ulrich Boettiger, Garden City, ID (US); Andrew Perkins, Boise, ID (US); Marc Sulfridge, Boise, ID (US); Swarnal Borthakur, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/723,147

(22) Filed: May 27, 2015

(51) Int. Cl.
- *H04N 5/225* (2006.01)
- *H04N 9/04* (2006.01)
- *H01L 27/146* (2006.01)

(52) U.S. Cl.
CPC ...... *H04N 5/2254* (2013.01); *H01L 27/14621* (2013.01); *H01L 27/14623* (2013.01); *H01L 27/14627* (2013.01); *H04N 9/045* (2013.01)

(58) Field of Classification Search
CPC .................. H04N 5/2254; H04N 9/045; H01L 27/14621; H01L 27/14627; H01L 27/14623
See application file for complete search history.

(56) References Cited

U.S. PATENT DOCUMENTS

| | | |
|---|---|---|
| 2007/0166511 A1 | 7/2007 | Wang et al. |
| 2007/0237888 A1 | 10/2007 | Liu et al. |
| 2007/0238034 A1 | 10/2007 | Holscher, Jr. |
| 2009/0020838 A1 | 1/2009 | Lin et al. |
| 2009/0090850 A1* | 4/2009 | Liu .................. H01L 27/14621 250/226 |
| 2009/0101946 A1 | 4/2009 | Hwang |
| 2010/0060769 A1 | 3/2010 | Inuiya |
| 2010/0110271 A1 | 5/2010 | Yanagita et al. |
| 2010/0230729 A1 | 9/2010 | Ellis-Monaghan et al. |
| 2010/0245637 A1 | 9/2010 | Itonaga |
| 2010/0253819 A1 | 10/2010 | Yokozawa |

(Continued)

FOREIGN PATENT DOCUMENTS

WO 2007145373 12/2007

OTHER PUBLICATIONS

Mackey, U.S. Appl. No. 14/012,835, filed Aug. 28, 2013.

*Primary Examiner* — Gevell Selby
(74) *Attorney, Agent, or Firm* — Treyz Law Group, P.C.; Joseph F. Guihan

(57) ABSTRACT

An imaging system may include an image sensor having an array of pixels. The image sensor may include an array of microlenses formed over a substrate and an array of color filter elements interposed between the microlenses and the substrate. Dielectric wall structures may be interposed between the color filter elements. Light shield structures may be formed within or on the dielectric wall structures and may be used to reduce optical crosstalk between adjacent pixels. The light shield structures may be formed on opposing sides or corners of the color filter elements and may partially or fully extend along the height of the color filter elements. In some arrangements, the light shield structures may each have a vertical portion that contacts a side surface of an adjacent color filter element and a horizontal portion that contacts a lower surface of an adjacent color filter element.

20 Claims, 13 Drawing Sheets

(56) References Cited

U.S. PATENT DOCUMENTS

| | | | |
|---|---|---|---|
| 2011/0108938 A1* | 5/2011 | Nozaki | H01L 27/14621 257/432 |
| 2012/0019695 A1 | 1/2012 | Qian et al. | |
| 2012/0200749 A1* | 8/2012 | Boettiger | H04N 5/359 348/273 |
| 2012/0273906 A1* | 11/2012 | Mackey | H01L 27/14605 257/432 |
| 2014/0313379 A1* | 10/2014 | Mackey | H04N 5/3651 348/279 |

* cited by examiner

US 9,497,366 B1

IMAGING SYSTEMS WITH INTEGRATED LIGHT SHIELD STRUCTURES

BACKGROUND

This relates generally to imaging systems, and more particularly to imaging systems with light shields to reduce optical crosstalk.

Image sensors are commonly used in electronic devices such as cellular telephones, cameras, and computers to capture images. In a typical arrangement, an electronic device is provided with an array of image pixels and one or more lenses that focus image light onto the array of image pixels. Circuitry is commonly coupled to each pixel column for reading out image signals from the image pixels.

In conventional imaging systems, stray light and optical crosstalk can cause unwanted image artifacts such as veiling glare, local flare, and reduced quantum efficiency. For example, light may enter an imaging system and may be reflected back and forth between surfaces of lens elements in the imaging system before finally reaching the array of image pixels. In other situations, stray light may enter the imaging system at a high angle of incidence and may be directed on an unintended path, leading to optical crosstalk. This type of stray light and optical crosstalk can cause bright streaks, reduced contrast, and, in some cases, undesirable color tints in dark regions of an image.

It would therefore be desirable to be able to provide imaging systems with reduced optical crosstalk and improved quantum efficiency.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
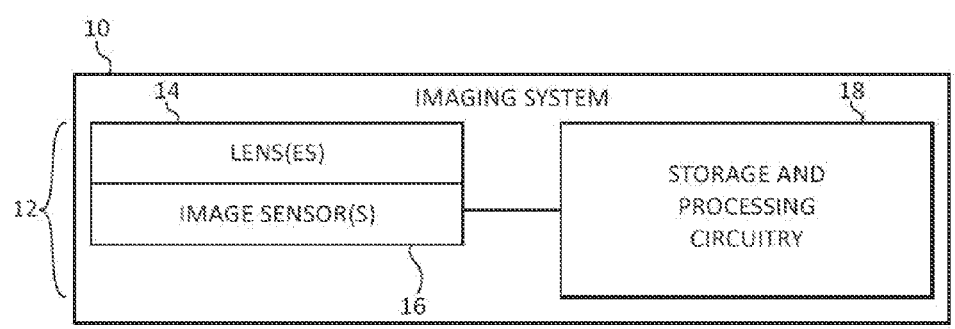
FIG. 1 is a diagram of an illustrative imaging system in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18. If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
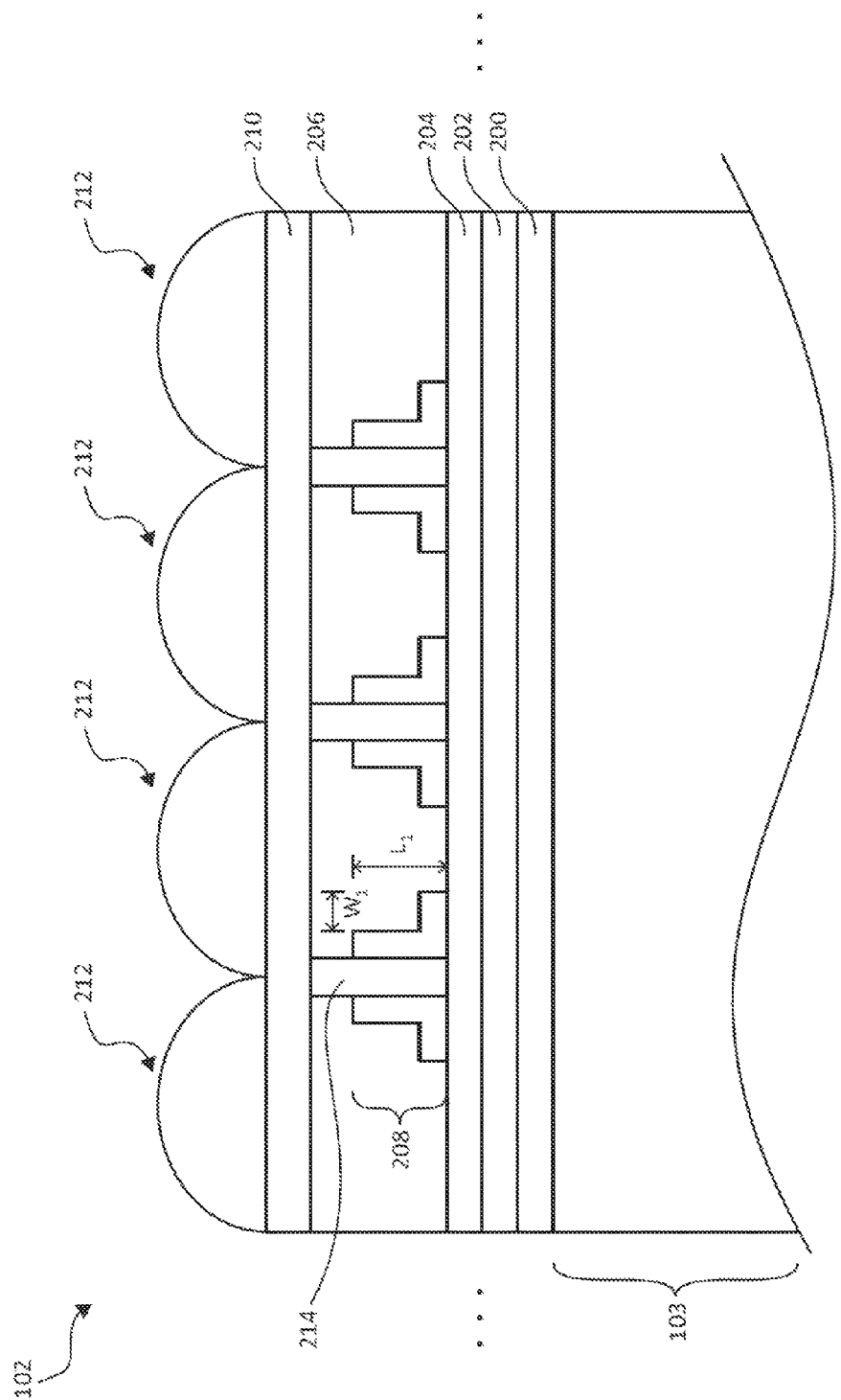
FIG. 2 is a cross-sectional view of a portion of an illustrative pixel array having light shields between color filter elements in accordance with an embodiment of the present invention.

As shown in FIG. 2, image sensor 16 of camera module 12 may include one or more arrays of image pixels such as image pixel array 102. An antireflective coating (ARC) layer 200 may be formed on a light-sensitive side of the image sensor 16, which may be referred to herein as the back side of substrate 103. ARC layer 200 may serve to ensure that the light entering substrate 103 from the back side is not reflected back towards the direction from which it arrived. A first dielectric layer (e.g., an oxide layer) 202 may formed on the ARC layer 200. A first passivation layer 204 may be formed on the first dielectric layer 202.

Color filter elements 206 may be formed over the first passivation layer 204. Color filter elements 206 may be part of a color filter array (CFA) within the image sensor 16 of FIG. 1. Color filters 206 may include red color filters, green color filters, blue color filters, infrared (IR) filters, clear filters, or filters of other colors. If desired, the color filters may be arranged in a Bayer pattern or in any other suitable pattern. Color filter wall structures 214 (e.g., oxide or any other suitable material having a lower refractive index than color filters 206) may be interposed between the color filter elements 206. The color filter wall structures may sometimes be referred to as color filter barriers. A planarization layer 210 may be formed over the color filter elements 206. Microlenses 212 may be formed on planar layer 210. Microlenses 212 may serve to direct light towards the photosensitive regions.

As shown in FIG. 2, image sensor 16 may include light shields such as light shield structures 208 (sometimes referred to as light barriers or metal light shields). Light shields 208 may be located between adjacent color filter elements and may be used to reduce optical crosstalk and improve the quantum efficiency of the pixels in image sensor 16. Light shields 208 may, if desired, have an L-shaped cross-section. For example, light shields 208 may have a vertical portion and a horizontal portion. The vertical portion may be interposed between a pair of adjacent color filter elements 206 and may contact sidewalls of the adjacent color filter elements 206, while the horizontal portion may extend under an adjacent color filter element 206 and may contact a lower surface of the color filter element 206. Vertical portions of light shields 208 may partially or fully span the height of the color filters 206, and horizontal portions of light shields 208 may partially or fully span the width of color filters 206. There may be one, two, three, or more than three light shields around a given color filter element 206. In one suitable arrangement, first and second light shields 208 may be located on opposing corners of a given color filter element 206. This is, however, merely illustrative. If desired, color filters 206 may each be completely surrounded by light shields 208.

Light shields 208 may be formed from aluminum, tungsten, or any other suitable opaque, thin film metal. Light shields 208 may absorb all incident light, may reflect all incident light, or may absorb a portion of incident light while reflecting another portion of incident light. Light shields 208 may, in general, be formed from any suitable light-blocking material. Arrangements in which light shields 208 are formed from metal are sometimes described herein as an example.

The L-shape of light shields 208 may help reduce optical crosstalk in both the horizontal and vertical directions. Light shield portions in the horizontal direction may be represented by width $W_1$. Light shields portions in the vertical direction may be represented by length $L_1$.

Figure 3:
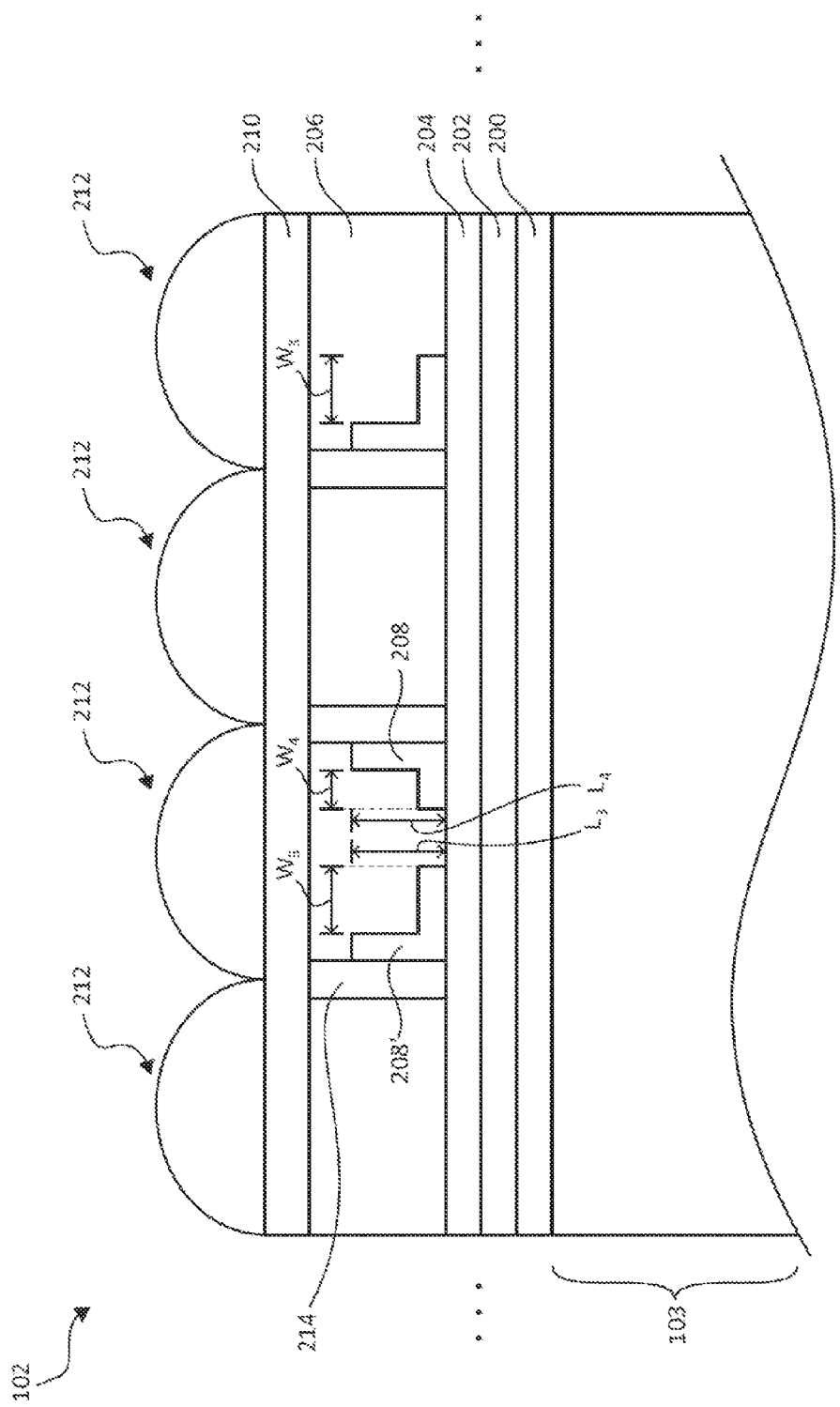
FIG. 3 is a cross-sectional view of an illustrative pixel array having light shields with varying dimensions in accordance with an embodiment of the present invention.

As shown in FIG. 3, light barriers 208 and 208' may be of varying sizes. Light barrier 208' may have a horizontal portion with length $W_3$ that is longer than the length $W_4$ of the horizontal portion of light barrier 208. The extended portion of light barrier 208' may help reduce optical crosstalk resulting from incoming light with a high angle of incidence. The example of FIG. 3 in which $W_3$ is longer than $W_4$ is merely illustrative. If desired, $W_3$ may be less than $W_4$, or $W_3$ and $W_4$ may be equal.

If desired, lengths $L_1$ and $L_2$ of the vertical portions of light shields 208 may also be varied. Lengths $L_1$ and $L_2$ may be equal, length $L_1$ may be shorter than length $L_2$, or length $L_2$ may be shorter than length $L_1$. The vertical portions of light shields 208 may partially or fully span the height of the color filters 206.

Figure 9:
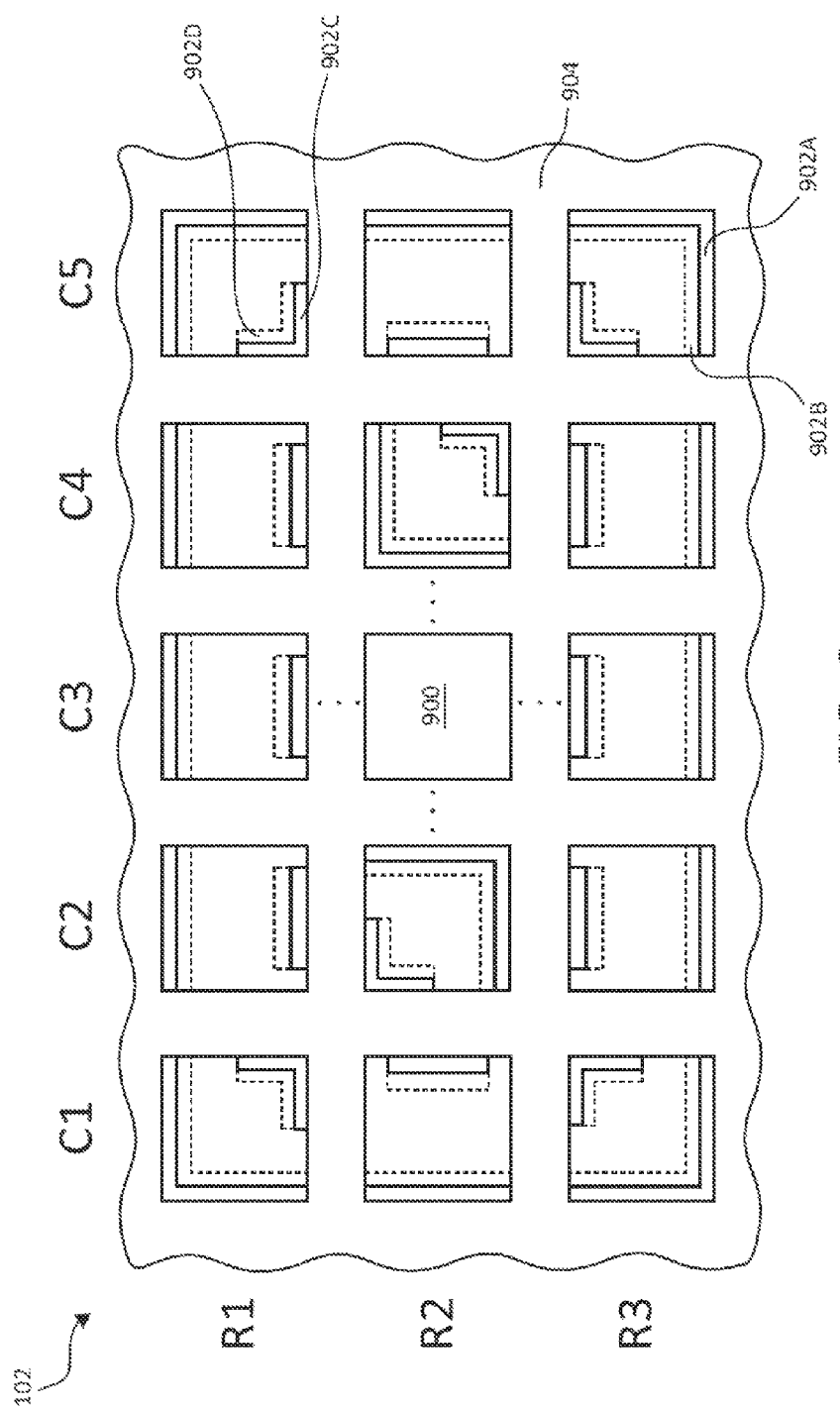
FIG. 9 is a top down view of an illustrative pixel array having light shields with different positions and shapes in accordance with an embodiment of the present invention.
Figure 10:
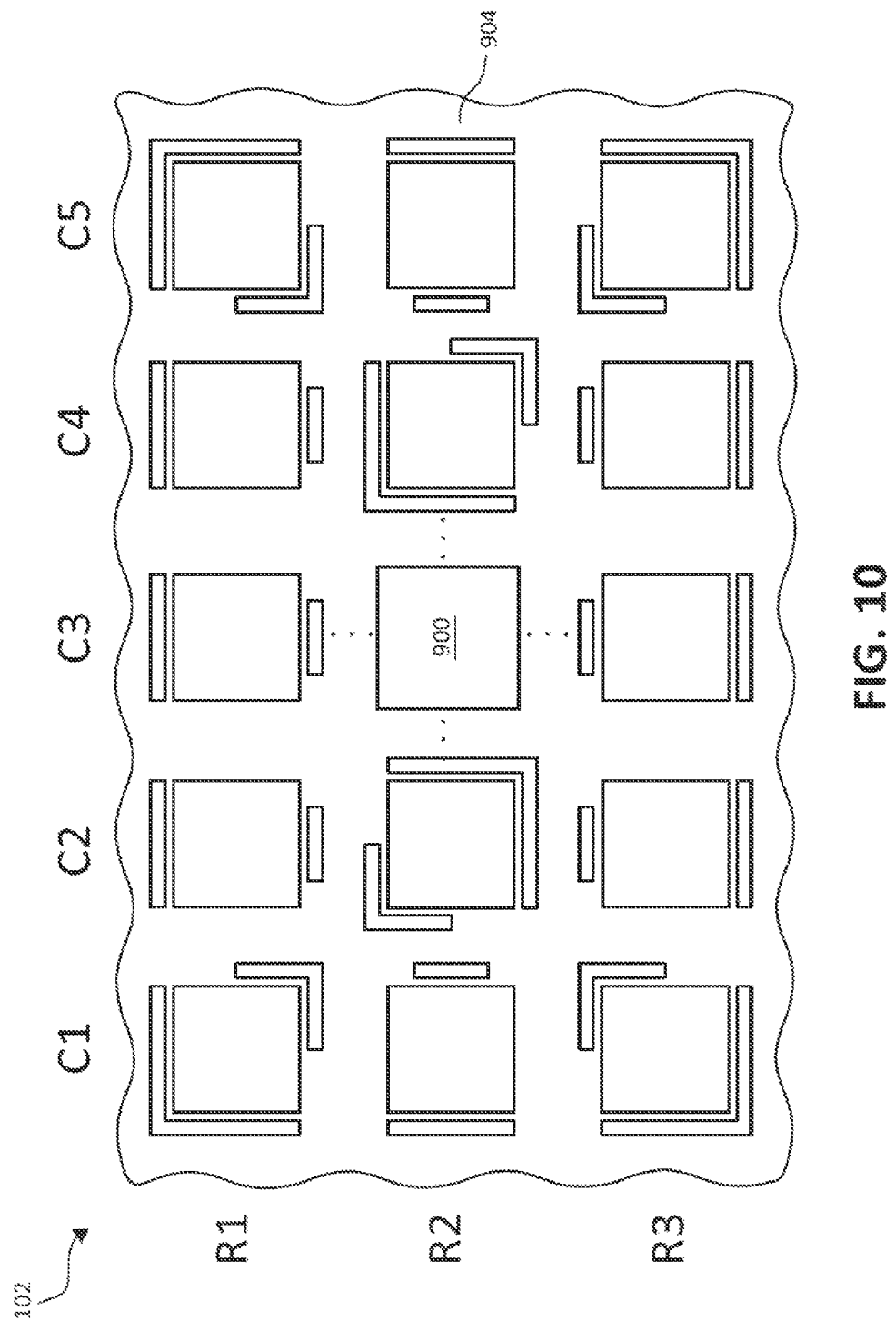
FIG. 10 is a top down view of an illustrative pixel array having light shields with different positions and shapes in accordance with an embodiment of the present invention.

Light shields may vary across the pixel array to optimize the pixel response of individual pixels. For example, the height, width, thickness, position (e.g., position within the array and/or the position between two adjacent color filters), and/or material of light shields may be varied within the pixel array to achieve a desired pixel response for a given pixel or group of pixels. This may include, for example, varying one or more characteristics of the light shields to accommodate incoming light with different angles of incidence. The incident light angle range that a pixel should respond to (e.g., light rays within the chief ray angle and marginal light rays) may be based on the characteristics of the camera lens over the pixel array. Since the angles of incoming light vary radially across the array, the light shields may be arranged in a radially symmetric fashion around the pixels in order to achieve pixel optimization, in the vertical and horizontal directions, as well as the azimuthal direction. In one illustrative example (e.g., as shown in FIGS. 9 and 10), light shields may surround a greater portion of the color filter elements (e.g., may wrap around corners of color filter elements) for pixels that are further from the center of the array in order to optimize pixel response for different incident angles of incoming light.

As another example, pixel array 102 may include phase detection pixels (e.g., for determining distances to objects in a scene and/or for performing autofocus operations). If desired, characteristics of light shields 208 may be customized for the phase detection pixels to optimize phase detection pixel performance.

Similar to FIG. 2, light barriers 208 and 208' of FIG. 3 may be formed within color filter elements 206. This may help significantly reduce or eliminate optical crosstalk in pixel array 102. If desired, light barriers 208 and/or 208' may only be formed in select pixels. In one illustrative arrangement, shields 208 may be applied to pixels based on the spectral sensitivities of the pixels. For example, red pixels may be free of shields 208 to maximize the quantum efficiency of the red pixels, whereas blue pixels may be provided with shields 208. This is merely illustrative, however. In general, any one or more of the pixels in array 102 may be provided with light shields 208. Varying the position and shape of shields 208 across pixel array 102 may help maximize the pixel response to angled light while minimizing crosstalk and shading effects.

Figure 4:
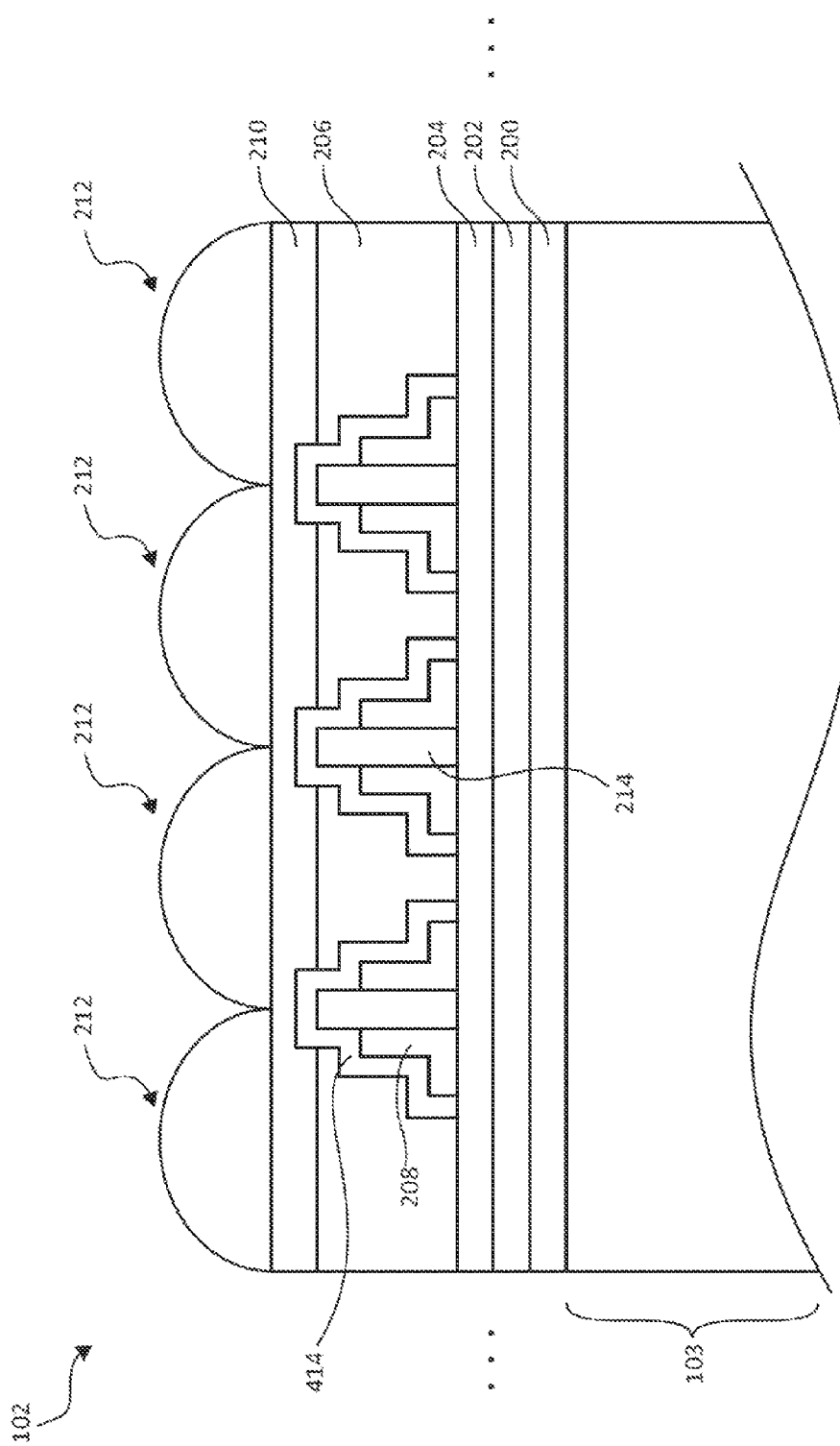
FIG. 4 is a cross-sectional view of an illustrative pixel array having light shields surrounded by a passivation material in accordance with an embodiment of the present invention.

FIG. 4 illustrates another suitable embodiment in which the light shields 208 may be formed within the color filters 206. Color filter wall structures 214 may be interposed between color filters 206. A passivation layer 414 may be formed over the light shields to prevent corrosion during the color filter manufacturing process. Passivation layer 414 may be a thin oxide or other suitable passivation material. A planarization layer 210 may be formed over passivation layer 414. Microlenses 212 may be formed over the planarization layer 212.

Figure 5:
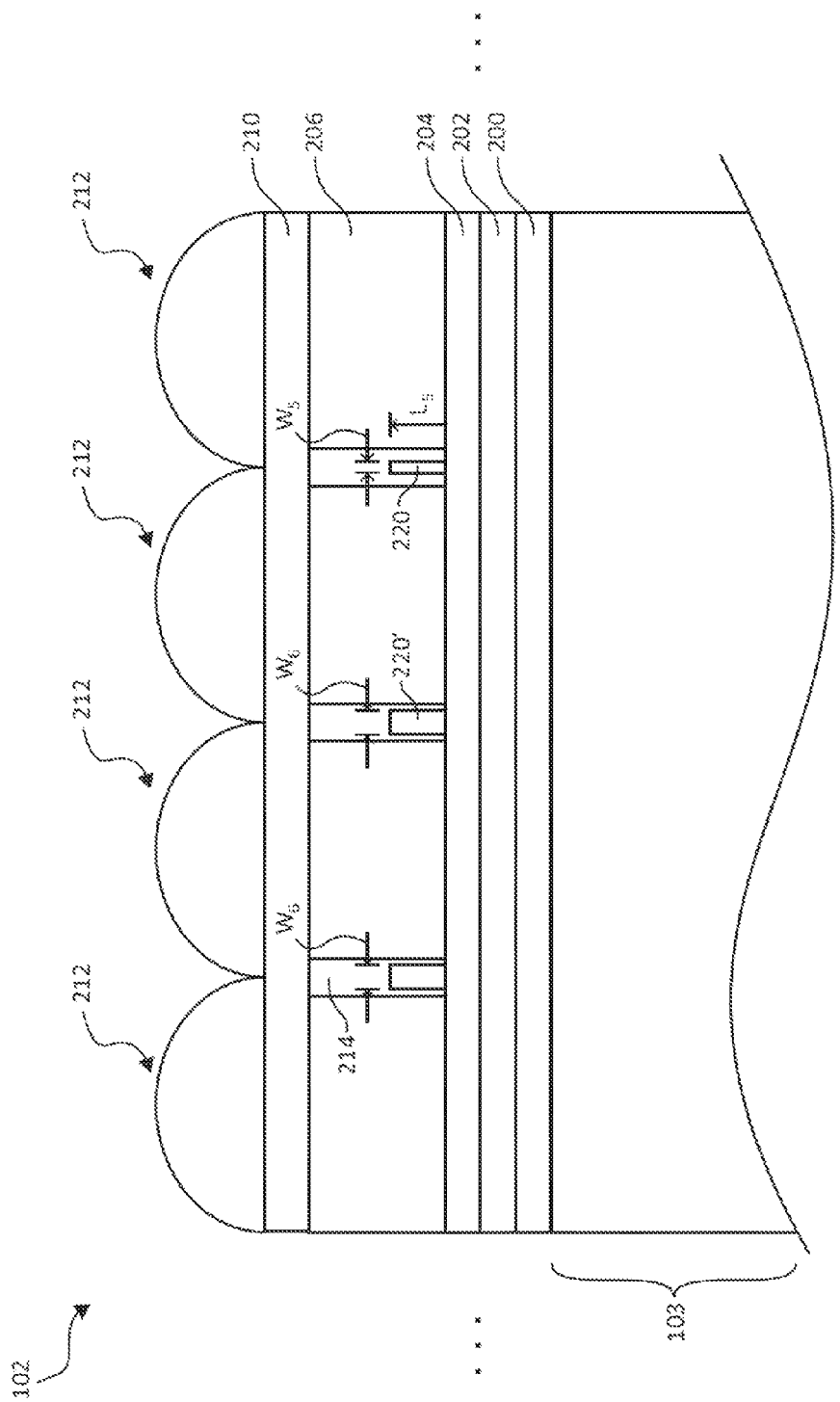
FIG. 5 is a cross-sectional view of an illustrative pixel array having light shields with different widths in accordance with an embodiment of the present invention.

FIG. 5 shows light shields 220 and 220' that may be partially embedded within color filter barrier structures 214. In the illustrative arrangement of FIG. 5, light shields 220 and 220' extend in the vertical direction, denoted by length $L_5$. Metal shield 220 may have a width $W_5$, while metal shield 220' may have a width $W_6$. Dimensions $W_5$ and $W_6$ represent the thickness of the metal shields, and may be referred to as such herein. The thicknesses of the metal shields may vary and are not limited to this embodiment. For example, $W_5$ may be greater than $W_6$, $W_5$ and $W_6$ may be equal, or $W_5$ may be less than $W_6$. If desired, metal shields may be placed in select locations (e.g., around pixels that are more susceptible to crosstalk).

In the illustrative arrangement of FIG. 5, the light shields 220 do not contact the color filters 206. Rather, the light shields may be contained within the color filter barrier structures 214 without contacting color filters 206.

Figure 6:
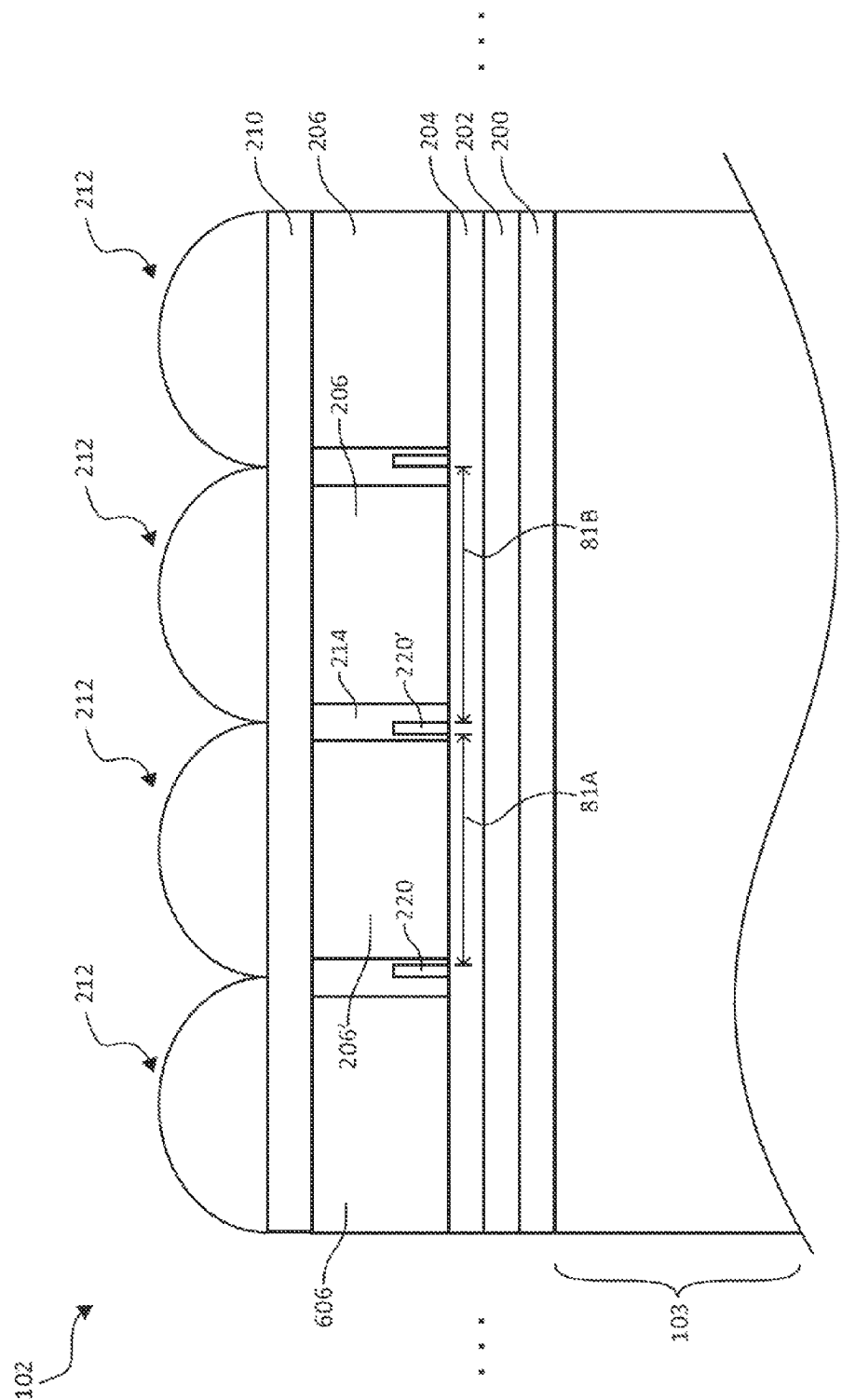
FIG. 6 is a cross-sectional view of an illustrative pixel array having light shields offset relative to centers of dielectric walls in accordance with another embodiment of the present invention.

FIG. 6 illustrates another suitable arrangement in which light shields 220 are at least partially embedded within the color filter wall structures 214. In this embodiment, light shields 220 and 220' may be offset relative to the center of color filter wall structures 214. Varying the placement of light shields 220 may provide color filters 206 with different apertures through which light can pass. For example, as shown in FIG. 6, the varying position of light shields 220 and 220' relative to the center of wall structure 214 creates opening 81A having a first size and opening 81B having a second size. If desired, the light shields in some pixels (e.g., red pixels) may form larger openings than the light shields in other pixels (e.g., green pixels) in order to minimize crosstalk and increase the quantum efficiency of the pixels. This is, however, merely illustrative. If desired, the apertures defined by light shields 220 may all be the same size, may all be of different sizes, or may have any other suitable arrangement.

Figure 7:
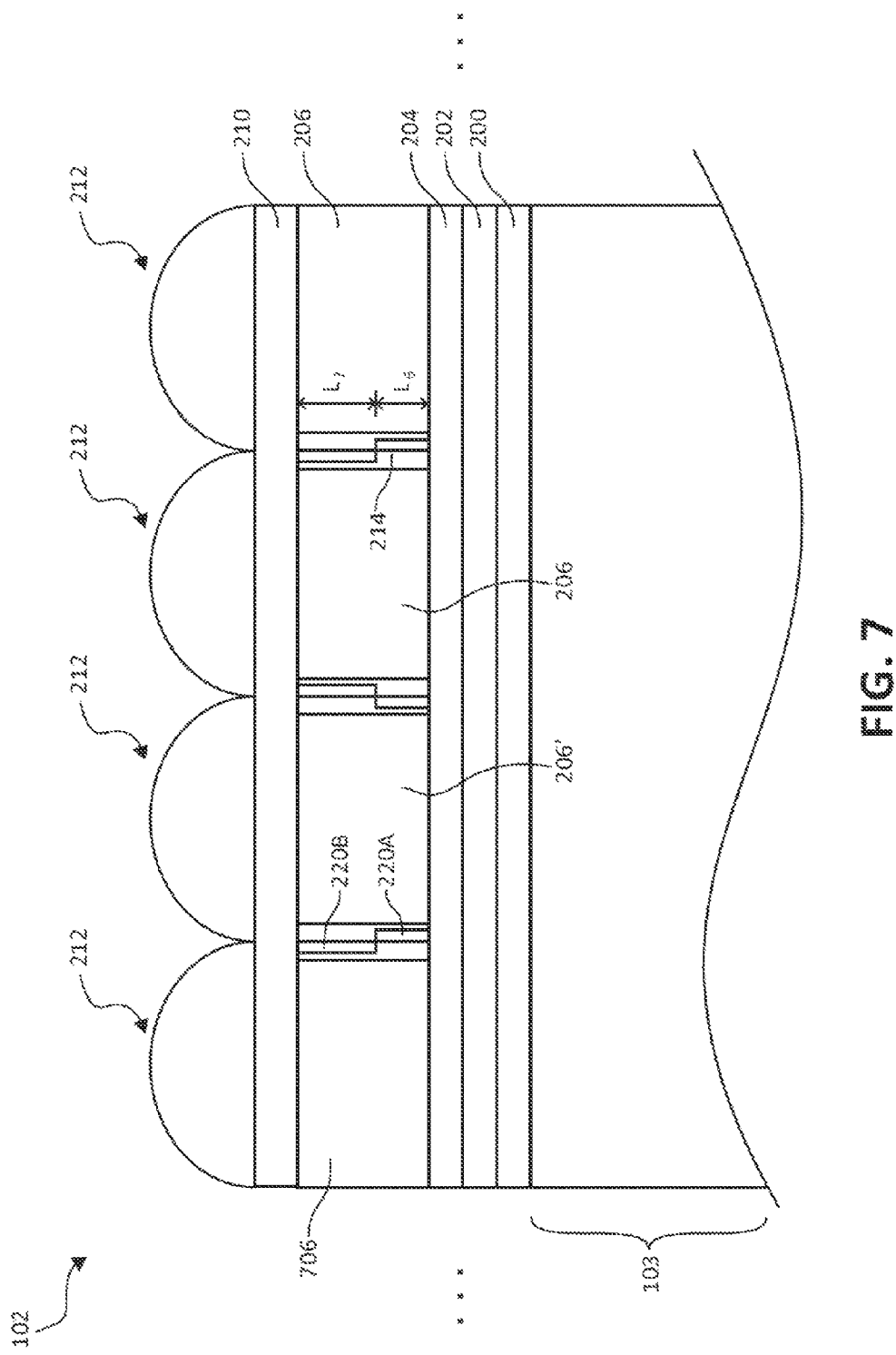
FIG. 7 is a cross-sectional view of an illustrative pixel array having sloped light shields in accordance with another embodiment of the present invention.

FIG. 7 shows light shield segments 220A and 220B formed within the color filter wall structures 214. The color filter wall structures 214 may be interposed between color filters 206. As shown, light shield portions 220A and 220B may be extended light shields (e.g., may span the entire height of color filter wall structures 214) and may be sloped. Sloped light shields may be formed using multiple segments of light shield material that are offset from one another. The offset of the different light shield segments may help to block high angle stray light and to prevent crosstalk. The example of FIG. 7 in which each sloped light shield includes two light shield segments is merely illustrative. If desired, there may be three or more light shield segments which may create the desired slope for blocking high angle stray light and reducing crosstalk.

As shown, light shield segments 220A and 220B may slope inward toward a lower surface of color filter 206' and may create a smaller aperture at the lower surface, and a larger aperture at an upper surface. Conversely, light shield segments 220A and 220B may slope outward and away from a lower surface of color filter 206 which may create a smaller aperture at the lower surface, and a larger aperture at an upper surface. This may help prevent crosstalk from color filters which tend to diffract light onto adjacent color filters. If desired, light shield portions 220A and 220B may be placed in a funnel-like manner around color filters that are more prone to receiving stray light. In other pixels (e.g., red pixels), light shields may not be present or may not have a funnel shape, resulting in increased quantum efficiency and reduced optical crosstalk.

Vertical lengths $L_6$ of light shield portion 220A may be shorter than length $L_7$ of light shield portion 220B in this embodiment. However, the lengths of light shield portions may vary and are not limited to the arrangement of FIG. 7. For example, $L_6$ may be longer than $L_7$, $L_6$ and $L_7$ may be equal, $L_6$ and $L_7$ may be equal to the height of the color filters 206 or 206', $L_6$ and $L_7$ may less than the height of the color filters 206 or 206', or any other suitable arrangement.

Figure 8:
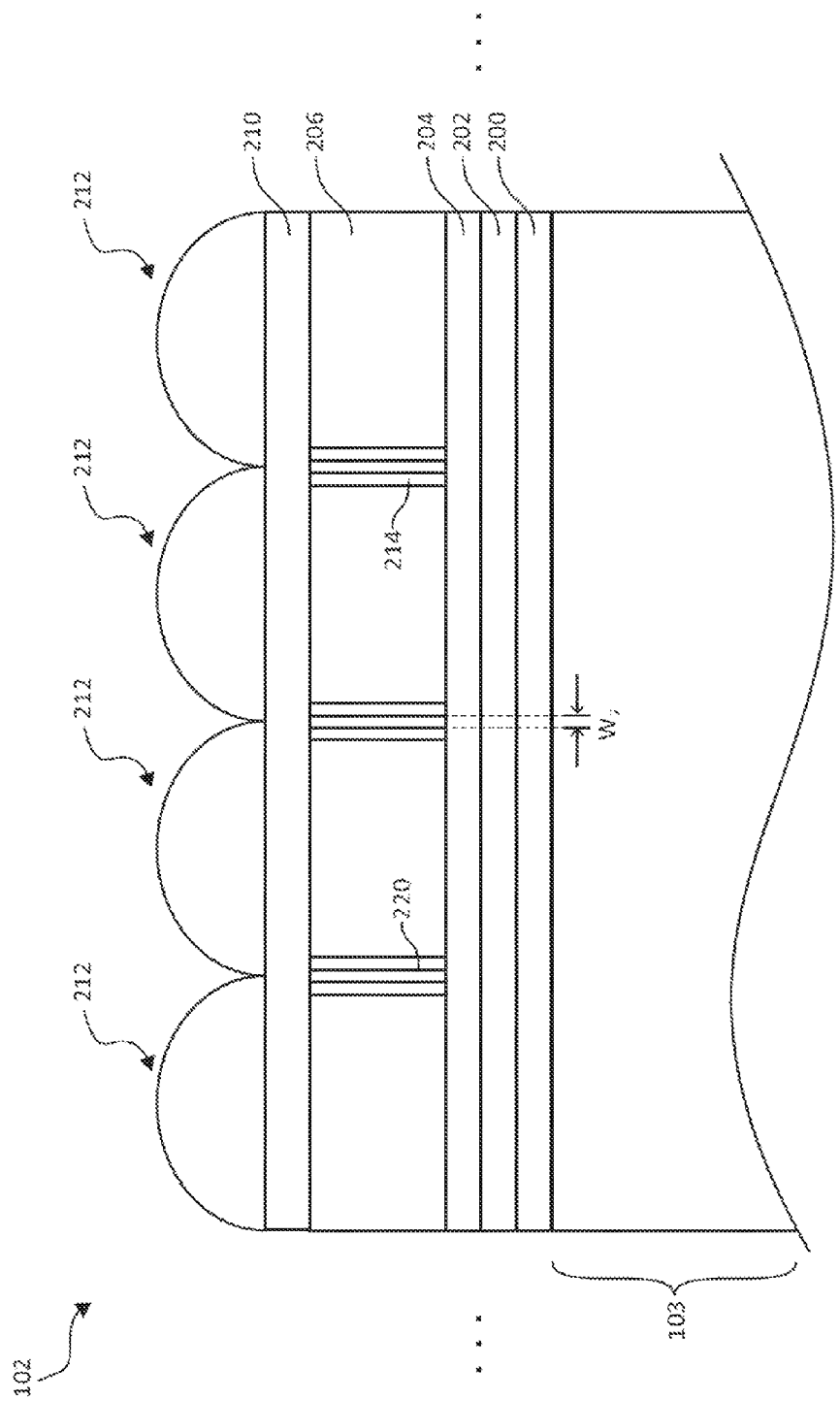
FIG. 8 is a cross-sectional view of an illustrative pixel array having extended light shields with varying widths between the color filter elements in accordance with an embodiment of the present invention.

FIG. 8 shows another suitable embodiment in which light shields 220 fully span the height of the color filters 206. The light shields 220 may be embedded within the color filter barrier structures 214. Light shield 220 may have a width $W_7$, which represents the thickness of the metal shields. Planarization layer 210 may be formed over the color filters 206 and color filter barrier structures 214. Microlenses 212 may then be formed over the planar layer 210.

FIG. 9 is a top down view of the pixel array with light shields of the type shown in FIGS. 2-4. The positions of the pixels in pixel array 102 are arbitrary compared to the central pixel 900. There might be several pixels between the center pixel 900 and the surrounding pixels shown in FIG. 9. Light shield 902A may fully extend the length of adjacent pixel walls in the vertical direction from high angle stray light. Light shield 902B blocks high angle light in the horizontal direction, represented by the dashed line. In this embodiment, the light shields may be formed within the pixel.

Light floods the pixels radially from center pixel 900. If desired, the vertical portions of the light shields 902A may be longer for pixels that are further from the center. For example, the farther a pixel is relative to center pixel 900, the longer the vertical portion of the light shield 902A may be. This is primarily to mitigate crosstalk and to shield against high angle stray light. For example, light shield 902A in [R3, C5] may have a greater length than a light shield in [R2, C4]. This concept may also apply to horizontal light shields 902B. As the pixels move further from central pixel 900, the horizontal light shield 902B may increase in length to reduce high angle stray light and mitigate optical crosstalk. This is, however, merely illustrative. If desired, light shields 902A may all have vertical portions and/or horizontal portions with the same length.

Light shield 902C may partially extend adjacent pixel walls in order to prevent optical crosstalk in the vertical direction. Light shield 902D may mitigate crosstalk in the horizontal direction, represented by a dashed line in FIG. 9. These relatively shorter light shields, as compared to light shields 902A and 902B, may serve to reduce crosstalk within the pixels The pixels may be isolated by dielectric material 904 (e.g., oxide or other suitable dielectric material).

FIG. 10 illustrates an arrangement in which light shields may be formed in the oxide region 904 (e.g., as shown in FIGS. 5-8). Light shields 950 and 950A may reduce crosstalk and mitigate high angle stray light in the vertical direction. As with the arrangement of FIG. 9, longer light shields may be used for pixels that are farther from central pixel 900. For example, light shield 950 in [R2, C2] may have a shorter length than light shield 950 in [R1, C1]. This is to reduce crosstalk between the pixels and to block high angle light. If desired, shorter light shields on the opposing corners, for example 950A, may also be used to reduce crosstalk and stray light.

Figure 11:
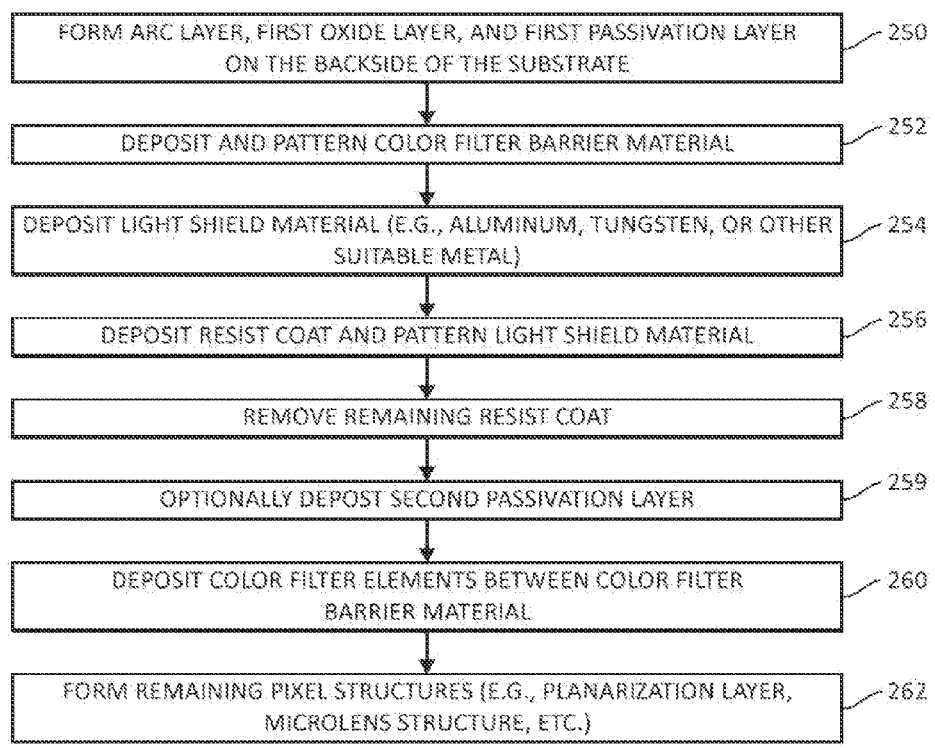
FIG. 11 is a flow chart of illustrative steps involved in forming a color filter array having light shields of the type shown in FIGS. 2-4 in accordance with an embodiment of the present invention.

FIG. 11 is a flow chart of illustrative steps involved in forming a color filter array having light shields/light absorbers for reducing optical crosstalk, mitigating high angle stray light, and increasing quantum efficiency between image pixels related to the embodiments in FIGS. 2-4.

At step 250, an anti-reflective coating (ARC) layer, a first oxide layer, and a first passivation layer (e.g., a nitride layer) may be formed on the light-sensitive side of a substrate (e.g., substrate 103).

At step 252, color filter barrier material to form color filter barrier structures is deposited and patterned. This may include, for example, depositing color filter barrier material such as oxide material or any suitable material with a lower refractive index than material used to form color filters. This layer may then be etched to form color filter wall structures.

At step 254, light shield material (e.g., aluminum, tungsten, or other suitable metal) is deposited over the color filter barrier material.

At step 256, a resist coat may be formed and the light shields are patterned to the desired shape, while the excess light shield material is removed. The resist coat may be used to protect the light shields during the etching process.

At step 258, the remaining resist coat may be removed. Step 259 is an optional step in which a second passivation layer (e.g., a nitride layer) may be deposited over the light shields.

At step 260, color filter elements are deposited between the color filter barrier structures and light shields structures. At step 262, the remaining pixel structures (e.g., planarization layer, microlens structure, etc.) may be formed.

Figure 12:
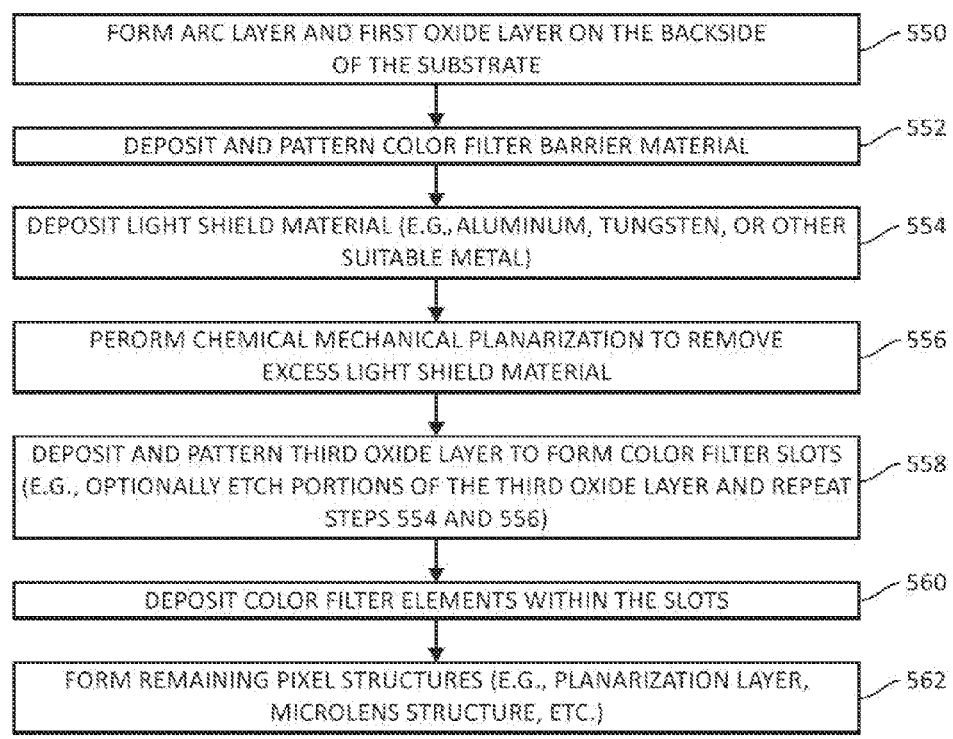
FIG. 12 is a flow chart of illustrative steps involved in forming a color filter array having light shields of the type shown in FIGS. 5-8 in accordance with an embodiment of the present invention.

FIG. 12 is a flow chart of illustrative steps involved in forming a color filter array having light shields/light absorbers for reducing optical crosstalk, mitigating high angle stray light, and increasing quantum efficiency between image pixels related to the embodiments in FIGS. 5-8.

At step 550, an antireflective coating (ARC) layer and a first oxide layer may be formed on a light-sensitive side (e.g., a backside of substrate 103).

At step 552, color filter barrier material to form color filter barrier structures is deposited and patterned. This may include, for example, depositing color filter barrier material such as oxide material or any suitable material with a lower refractive index than material used to form color filters. This layer may then be etched to form color filter wall structures.

At step 554, light shield material (e.g., aluminum, tungsten, or other suitable metal) is deposited over the color filter barrier material.

At step 556, chemical mechanical planarization (CMP) may be performed to remove the excess light shield material.

At step 558 a third oxide layer is deposited and patterned to form color filter slots. Optionally, prior to etching the color filter openings, steps 554 and 556 may be repeated to form extended light shields. The third oxide layer may be etched for additional deposition of light shield material and chemical mechanical planarization may be performed to remove excess light shield material. Step 558 may be repeated until the desired height for the light shield is achieved. For example light shields that extend to the height of the color filter elements may be formed.

At step 560, color filter elements are deposited in the color filter slots between the color filter barrier structures and light shields structures.

At step 562 the remaining pixel structures (e.g., planarization layer, microlens structure, etc.) may be formed.

Figure 13:
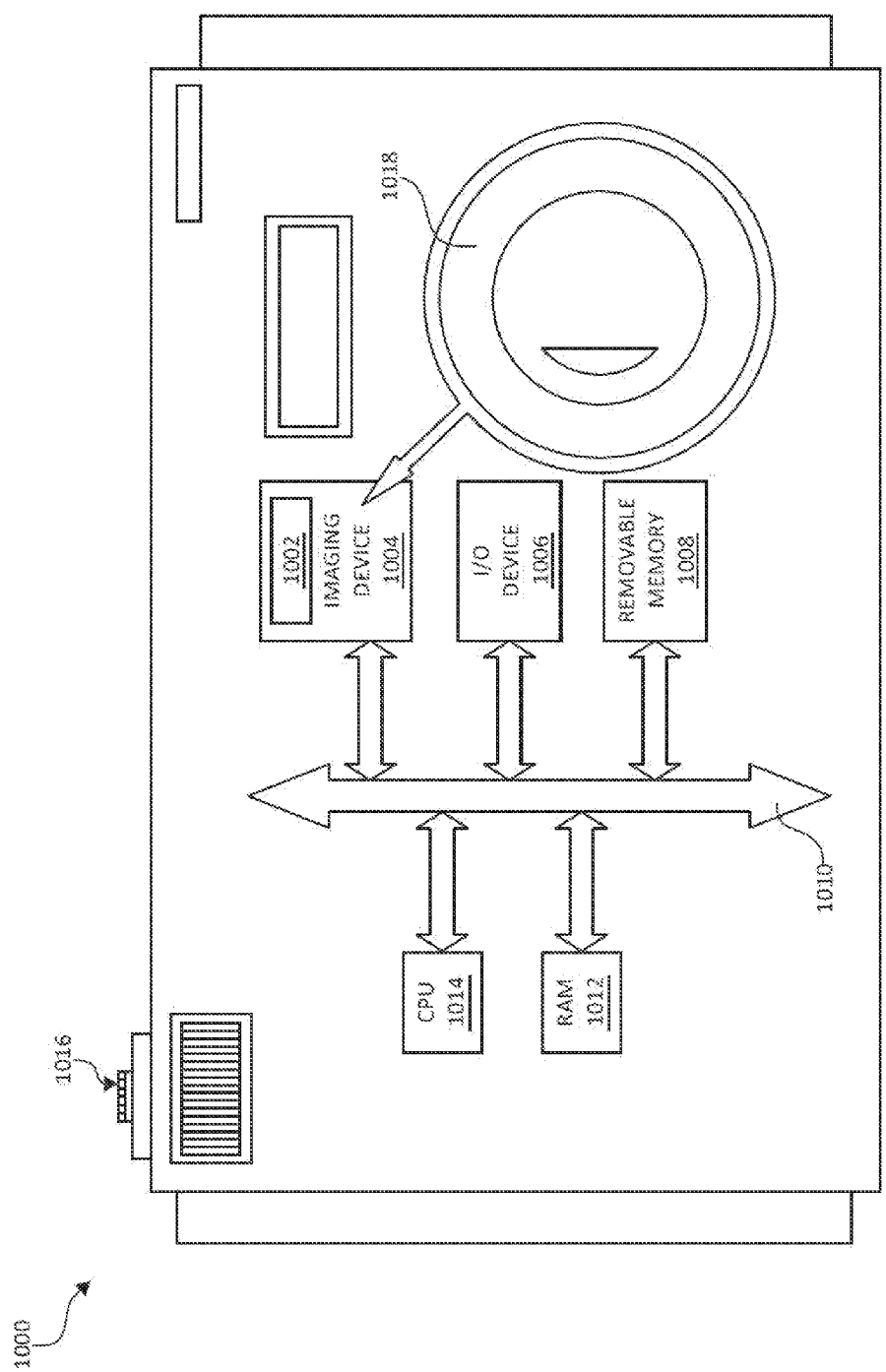
FIG. 13 is a block diagram of a system that may be used to employ the embodiments of FIGS. 1-12 in accordance with an embodiment of the present invention.

FIG. 13 shows in simplified form a typical processor system 1000, such as a digital camera, which includes an imaging device 1004. Imaging device 1004 may include a pixel array 1002 having pixels of the type shown in FIG. 1 (e.g., pixel array 1002 may be an array of image pixels formed on an image sensor SOC). Processor system 1000 is exemplary of a system having digital circuits that may include imaging device 1004. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 1000, which may be a digital still or video camera system, may include a lens such as lens 1018 for focusing an image onto a pixel array when shutter release button 1016 is pressed. Processor system 1000 may include a central processing unit such as central processing unit (CPU) 1014. CPU 1014 may be a microprocessor that controls camera functions and one or more image flow functions and communicates with one or more input/output (I/O) devices 1006 over a bus such as bus 1010. Imaging device 1004 may also communicate with CPU 1014 over bus 1010. System 1000 may include random access memory (RAM) 1012 and removable memory 1008. Removable memory 1008 may include flash memory that communicates with CPU 1014 over bus 1010. Imaging device 1004 may be combined with CPU 1014, with or without memory storage, on a single integrated circuit or on a different chip. Although bus 1010 is illustrated as a single bus, it may be one or more buses or bridges or other communication paths used to interconnect the system components.

Various embodiments have been described illustrating an electronic device (see, e.g., device 10 of FIG. 1) that includes an imaging system and host subsystems. An imaging system may include one or more image sensors. Each image sensor may include an array of image pixels formed on a semiconductor substrate. Each image pixel may include one or more photosensitive elements configured to convert incoming light into electric charges.

An array of image pixels may have color filters with corresponding microlenses. There may be barriers interposed between the color filters. The barriers may be formed of oxide, or may be formed of other suitable materials with a low refractive index (e.g., having a refractive index lower than the refractive index of the color filter elements). Light shields may be made of metal (e.g., aluminum) and may be formed within the oxide walls. The light shields may be completely isolated from the color filter elements, or may be formed directly within the color filter elements.

The light shields may either partially extend or fully extend the height of the color filter elements. The light shields may either be formed in all color filter elements, or may only be formed in some color filter elements. For example, they may only be formed in the color filter elements which are more prone to absorbing higher wavelength stray light, and/or color filter elements which are more prone to absorbing reflected light. Therefore the light shields may help reduce crosstalk and high angle stray light.

In one embodiment, the light shield may be formed in an "L" shape and may have a vertical portion between a color filter wall structure and a color filter element, which may contact a side surface of adjacent color filter elements, and a horizontal portion extending underneath one color filter element which may contact a lower surface of the color filter element. The horizontal portions of two light shields in the color filter may be of the same length, or may have different lengths. For example, the horizontal piece of one light shield may be longer than the horizontal piece of the other light shield. Additionally, the light shields may be covered with passivation material for protection during the manufacturing stage of the color filter elements.

In another embodiment, there may only be a vertical light shield formed within the oxide barrier without contacting the color filter elements. These light shields may have uniform thickness, or may have differing thicknesses. A combination of thicknesses may be used within the pixel array. Additionally, the light shields may be formed off-center within the barriers imposed between the color filter elements. They may be formed closer to certain color filters with more sensitive pixels. For example, the light shields may be formed closer to a green color filter, which may absorb more stray light, than a red color filter. The light shields may also be formed of several portions which are not vertically aligned. For example, if a certain slope is desired to mitigate incoming high angle stray light, the light shield portions may be offset to achieve the desired slope.

The foregoing is merely illustrative of the principles of this invention and various modifications can be made by those skilled in the art without departing from the scope and spirit of the invention. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An image sensor having an array of image pixels, comprising:
   a substrate;
   an array of microlenses formed over the substrate;
   an array of color filter elements interposed between the microlenses and the substrate;
   a plurality of dielectric walls, wherein each of the dielectric walls is interposed between a respective pair of the color filter elements, wherein each of the dielectric walls is entirely dielectric, and wherein each of the dielectric walls has first and second opposing sides; and
   a plurality of metal light shields, wherein each of the metal light shields is at least partially interposed between a respective one of the dielectric walls and a respective one of the color filter elements, wherein each of the dielectric walls has a first metal light shield formed on the first side of the dielectric wall and a second metal light shield formed on the second side of the dielectric wall.

2. The image sensor defined in claim 1, wherein the color filter elements have a first refractive index and wherein the dielectric walls have a second refractive index that is less than the first refractive index.

3. The image sensor defined in claim 1 wherein each of the metal light shields has a height that is less than the height of the color filter elements.

4. The image sensor defined in claim 1 wherein each of the metal light shields has a height that is equal to the height of the color filter elements.

5. The image sensor defined in claim 1, further comprising:
   a planarization layer formed over the array of color filter elements; and
   a passivation layer formed under the array of color filter elements, wherein each dielectric wall directly contacts the planarization layer and the passivation layer.

6. The image sensor defined in claim 1, wherein at least one characteristic of the metal light shields varies within the array of image pixels, and wherein the characteristic is selected from the group consisting of: height, width, placement, and an amount by which the light barrier covers an adjacent color filter element.

7. An image sensor having an array of image pixels, comprising:
   a substrate;
   an array of microlenses formed over the substrate;
   an array of color filter elements interposed between the microlenses and the substrate;
   a plurality of color filter barrier structures, wherein each of the color filter barrier structures is interposed between a respective pair of the color filter elements; and
   a plurality of light barriers, wherein each of the light barriers at least partially surrounds an adjacent color filter element in the array of color filter elements, wherein each of the light barriers has a vertical portion that contacts a side surface of the adjacent color filter element and a horizontal portion that contacts a lower surface of the adjacent color filter element, wherein at least one characteristic of the light barriers varies within the array of image pixels, and wherein the characteristic is selected from the group consisting of: height, width, placement, and an amount by which the light barrier covers an adjacent color filter element.

8. The image sensor defined in claim 7 wherein each of the color filter elements is surrounded by a respective one of the light barriers.

9. The image sensor defined in claim 7 wherein the array of image pixels comprises first and second image pixels, wherein the first image pixel is closer to the center of the array than the second image pixel, and wherein the vertical portion of the light barrier in the second image pixel is longer than the vertical portion of the light barrier in the first image pixel.

10. The image sensor defined in claim 7 wherein the plurality of light barriers includes first and second light barriers formed respectively on first and second opposing corners of the adjacent color filter element.

11. The image sensor defined in claim 10 wherein the horizontal portions of the first and second light barriers are the same length.

12. The image sensor defined in claim 10 wherein the horizontal portion of the first light barrier has a different length than the horizontal portion of the second light barrier.

13. The image sensor defined in claim 10 wherein the vertical portion of the first light barrier is the same length as the vertical portion of the second light barrier.

14. The image sensor defined in claim 10 wherein the vertical portion of the first light barrier has a different length than the vertical portion of the second light barrier.

15. The image sensor defined in claim 7 wherein the light barriers are covered by a passivation layer.

16. A system, comprising:
   a central processing unit;
   memory;
   input-output circuitry; and
   an image sensor, comprising:
      a grid of dielectric material having an array of openings;
      an array of color filter elements, wherein each color filter element is formed in a respective opening in the array of openings; and
      a plurality of metal light shields, wherein each of the metal light shields at least partially surrounds a respective one of the color filter elements and wherein each metal light shield is embedded in the grid of dielectric material and does not contact the array of color filter elements.

17. The system defined in claim 16 wherein at least one of the metal light shields has a varying thickness along a length of the metal light shield.

18. The system defined in claim 16 wherein the dielectric material forms a dielectric wall between a respective pair of color filter elements and wherein at least one of the metal light shields is offset with respect to a center of the dielectric wall.

19. The system defined in claim 16 wherein at least one of the metal light shields comprises first and second vertical portions, wherein a center of the first vertical portion is offset with respect to a center of the second vertical portion.

20. The system defined in claim 16 wherein the image sensor comprises an image pixel array having at least first and second pixels, wherein the first pixel is closer to the center of the array than the second pixel, and wherein the metal light shield surrounding the second pixel is larger than the metal light shield surrounding the first pixel.

* * * * *